US005110710A

United States Patent [19]

Tomita et al.

[11] Patent Number: 5,110,710

[45] Date of Patent: May 5, 1992

[54] LIGHT-SENSITIVE LITHOGRAPHIC PRINTING PLATE WHEREIN THE SUPPORT IS TREATED WITH AN AQUEOUS SOLUTION CONTAINING NITRITES

[75] Inventors: Yasuji Tomita; Hideyuki Nakai; Kiyoshi Goto, all of Hino, Japan

[73] Assignee: Konica Corporation, Tokyo, Japan

[21] Appl. No.: 702,104

[22] Filed: May 15, 1991

Related U.S. Application Data

[63] Continuation of Ser. No. 446,197, Dec. 5, 1989, abandoned.

[30] Foreign Application Priority Data

| | | | |
|---|---|---|---|
| Dec. 13, 1988 | [JP] | Japan | 63-312980 |
| Feb. 14, 1989 | [JP] | Japan | 1-35540 |
| Apr. 10, 1989 | [JP] | Japan | 1-90946 |

[51] Int. Cl.[5] ........................ G03C 1/77; G03F 7/021; G03F 7/027; C25D 5/44

[52] U.S. Cl. .................................... 430/278; 430/156; 430/165; 430/281; 430/286; 430/302; 205/201; 205/220

[58] Field of Search ............... 430/278, 156, 165, 281, 430/286, 302; 204/33, 38.3, 17

[56] References Cited

U.S. PATENT DOCUMENTS

| | | | |
|---|---|---|---|
| 3,039,910 | 6/1962 | Zelley | 204/33 |
| 3,166,444 | 1/1965 | Ehren et al. | 204/33 |
| 4,116,695 | 9/1978 | Mori et al. | 430/278 |
| 4,448,475 | 5/1984 | Reznick | 204/140 |
| 4,492,616 | 1/1985 | Pliefke et al. | 204/33 |
| 4,793,903 | 12/1988 | Holmquist et al. | 204/33 |
| 4,824,757 | 4/1989 | Aono et al. | 204/33 |

FOREIGN PATENT DOCUMENTS

| | | |
|---|---|---|
| 105170 | 4/1984 | European Pat. Off. . |
| 3120975 | 12/1982 | Fed. Rep. of Germany . |
| 2267888 | 11/1975 | France . |
| 2284902 | 4/1976 | France . |
| 349595 | 7/1977 | United Kingdom . |

*Primary Examiner*—Charles L. Bowers, Jr.
*Assistant Examiner*—John S. Chu
*Attorney, Agent, or Firm*—Frishauf, Holtz, Goodman & Woodward

[57] ABSTRACT

Disclosed is a light-sensitive lithographic printing plate which comprises an aluminum or aluminum alloy support having been pretreated and a light-sensitive layer provided thereon, wherein the surface of the support adjacent to the light-sensitive layer is treated by use of an aqueous solution containing at least one selected from the group consisting of nitric acid, nitrate, nitrous acid and nitrite. According to this invention, lithographic printing plates which are free from stain due to residual light-sensitive layer, excellent in developability, good in water retention at image area and excellent in press life, can be obtained.

10 Claims, No Drawings

LIGHT-SENSITIVE LITHOGRAPHIC PRINTING PLATE WHEREIN THE SUPPORT IS TREATED WITH AN AQUEOUS SOLUTION CONTAINING NITRITES

This application is a continuation of application Ser. No. 07/446,197, filed Dec. 5, 1989, (abandoned).

BACKGROUND OF THE INVENTION

This invention relates to a light-sensitive lithographic plate, specifically a light-sensitive lithographic plate which is improved in surface characteristics of a support, and more specifically a light-sensitive lithographic plate having an improved hydrophilic layer.

Light-sensitive lithographic printing plates, for example, positive light-sensitive printing plate, were conventionally composed of a support having a hydrophilic layer and a light-sensitive layer having ink affinity provided thereon. Lithographic printing plates are obtained by conducting an image exposure on a light-sensitive layer of such light-sensitive lithographic printing plates, developing the light-sensitive layer having been exposed by use of a developer to remove the exposed light-sensitive layer and have the surface of the hydrophilic support exposed, while the light-sensitive layer of the unexposed portion remains on the surface of the support to form image portions having ink affinity.

The printing using such lithographic printing plates is done by utilizing repellent or non-miscibility between water and oil. Specifically, after having the non-image portions of the printing plate wetted with water, applying an ink on the printing plate, then the ink is repelled by the wetting water or dampening solution on the non-image portions, resulting in selective deposition of ink only on the image portions. Transferring the ink on the image portions to the image-receiving material, printing matters having images corresponding to the above image portions are obtained.

Accordingly, the support for obtaining such a lithographic printing plate is required to have excellent hydrophilicity and water-retention when it is dipped in water, as well as good adhesion property with a light-sensitive layer which receives printing press. The light-sensitive layer is required to have ink affinity, high sensitivity to exposure, and also, as the most important condition, high press life.

As the support satisfying these conditions, most excellent is an aluminum plate. For obtaining enough adhesion property between the aluminum plate and the light-sensitive layer, there have been described, as a surface treating method for mechanically roughening the surface of the support, for example, Ball graining, Wire graining, Brash graining and other methods in Japanese Patent Publications No. 40047/1975 and No. 46003/1976, etc. Also, an electrolytic roughening method, by which a uniform and dense grain configuration is formed on the surface of the aluminum plate by using a hydrochloric acid bath, a nitric acid bath and the like and by applying direct or alternating current, is described in Japanese Patent Publication No. 28123/1973, U.S. Pat. No. 4,087,341, Japanese Unexamined Patent Publication No. 67507/1978, etc. Furthermore, Japanese Unexamined Patent Publication No. 150595/1981 discloses a method for controlling adhesion property between a support and a light-sensitive layer by effecting sealing treatment by use of hot water, sealing treatment by use of silicate, etc. onto the surface of the support.

As described above, further surface treatments are applied for imparting sufficient adhesion property between the support and the light-sensitive layer, as well as enhancing hydrophilicity and water retention of the support such as aluminum plate. For example, as such surface treatments, described in the specifications of Japanese Patent Publication No. 22063/1981, U.S. Pat. No. 2,246,683 and U.S. Pat. No. 3,160,506 were to enhance hydrophilicity and water retention of a metal surface by chemically treating the metal surface with use of potassium fluorozirconate to form a coating film. Also, Japanese Unexamined Patent Publication No. 131102/1978 describes a support whose hydrophilicity and water retention are enhanced by treating it with an aqueous solution of potassium fluorozirconate and subsequently an aqueous solution of sodium silicate.

However, in these methods, problems occur in press life and resistance to chemicals, when an effect of preventing stain in the non-image portions of lithographic printing plate obtained through development processing (hereinafter referred to as anti-stain effect) is sufficiently improved, while the effect becomes insufficient when the press life and resistance to chemicals are improved, accordingly it was difficult to improve three of anti-stain effect, press life and treating chemical resistance at the same time.

Such phenomenon appears more significantly when burning treatment is conducted which has been generally employed as a means for enhancing press life. The lithographic printing plate obtained from the support which was treated by the method mentioned above is no more applied to practical use.

The present inventors have extensively made researches in the light of the above problems, and found that a light-sensitive lithographic printing plate having high press life as well as enough water retention at the nonimage portions and being free from stain at the nonimage portions can be obtained by treating a surface of mainly aluminum support by use of specific treatment, resulting in accomplishment of this invention.

SUMMARY OF THE INVENTION

Accordingly, an object of this invention is to provide a light-sensitive lithographic printing plate which is free from residual components of the light-sensitive layer on the nonimage portions after exposure and development, and excellent in so-called development property and also possesses sufficient water retention at the nonimage portions.

Another object of this invention is to provide a light-sensitive lithographic printing plate which is long in press life and has resistance to chemicals and free from stain at the nonimage portions.

The above objects of this invention can be accomplished by a light-sensitive lithographic printing plate which comprises an aluminum or aluminum alloy support having been pretreated and a light-sensitive layer provided thereon, wherein the surface of the support adjacent to the light-sensitive layer is treated by use of an aqueous solution containing at least one selected from the group consisting of nitric acid, nitrate, nitrous acid and nitrite.

In this invention, the surface of the aluminum or aluminum alloy support is pretreated and then treated with an aqueous solution containing at least one of nitric acid, nitrate, nitrous acid and nitrite. The components of light-sensitive layer, particularly resinous components, are fixedly absorbed to the nonimage portions and difficult to be been removed when the light-sensitive lithographic printing plate is processed. Accordingly, water retention of the nonimage portions can be maintained sufficiently.

DESCRIPTION OF THE PREFERRED EMBODIMENTS

Hereinbelow, this invention will be described in detail.

The feature of this invention is to treat a pretreated surface of a support with use of an aqueous solution containing at least one of nitric acid, nitrate, nitrous acid and nitrite (hereinbelow, referred to the treating aqueous solution of this invention) before providing a light-sensitive layer thereon. By this treatment, the occurance of the stain at the nonimage portions can be prevented to enhance water retention.

The examples of the nitrate and nitrite used in this invention may include nitrate and nitrite of metals belonging to Ia, IIa, IIb, IIIb, IVa, IVb, VIa, VIIa and VIII groups in the periodic table and ammonium salts, i.e. ammonium nitrate and ammonium nitrite. Such metal salts may preferably include, for example, $LiNO_3$, $NaNO_3$, $KNO_3$, $Mg(NO_3)_2$, $Ca(NO_3)_2$, $Zn(NO_3)_2$, $Al(NO_3)_2$, $Zr(NO_3)_4$, $Sn(NO_3)_4$, $Cr(NO_3)3$, $Co(NO_3)_2$, $Mn(NO_3)_2$, $Ni(NO_3)_2$, $LiNO_2$, $NaNO_2$, $KNO_2$, $Mg(NO_2)_2$, $Ca(NO_2)_2$, $Zn(NO_2)_2$, $Al(NO_2)_3$, $Zr(NO_2)_4$, $Sn(NO_2)_4$, $Cr(NO_2)_3$, $Co(NO_2)_2$, $Mn(NO_2)_2$, $Ni(NO_2)_2$, particularly preferably nitrate and nitrite of alkali metals. Such nitrate and nitrite, of course, may be used in combination of two or more thereof. The aqueous solution containing at least one of nitric acid, nitrate, nitrous acid and nitrite usually contains 0.001 to 10% by weight of them.

The preferred conditions for treating the surface of the support with the above treating solution is to dip a pretreated support within the temperature range from a room temperature to about 100° C. for 15 to 300 seconds, or to coat the treating solution onto the support.

Preferred embodiment of this invention is a treatment in which the support is dipped in an aqueous solution containing 0.01 to 2% by weight of the above compounds at 50° to 80° C. for 30 to 180 seconds. More preferred embodiment of this invention is to dip the support in an aqueous solution containing 0.05 to 1% by weight of the above compounds at 70° to 80° C. for 50 to 80 seconds. The support treated with an aqueous solution containing the above compounds is then preferably dried. The preferred compound contained in the aqueous solution is sodium nitrite and potassium nitrite.

The aqueous solution containing at least one of nitric acid, nitrate, nitrous acid and nitrite may be added with additives, as occasion demands, for example, water soluble polymers, surfactants, etc.

As the support used in this invention, preferred is that having deflection property so that it can be set to usual lithographic printing machine, and being capable of standing a load applied during printing.

The support of this invention is to be pretreated before treating with the treating aqueous solution of this invention. The pretreatment is conducted according to degreasing treatment and graining treatment usually used in this technical field. Preferred pretreatment in this invention is to carry out graining treatment and desmut treatment successively.

The graining treatment is carried out mechanically to make the surface a rough face, and may be called as so-called mechanical roughening method, for example, a ball polishing, brush polishing, brast polishing methods, buff polishing, etc. Moreover, it is available to use so-called electrical roughening method by which the surface is electrically roughened, for example, the support is treated by electrical field treatment under alternating current or direct current in an electrolytic solution containing hydrochloric acid, nitric acid, etc.

Since the surface of the support having been pretreated as described above tends to form a smut, it is generally preferred to effect appropriate washing with water or a treatment such as alkaline etching to remove the smut. Such a treatment may include an alkaline etching method as described in Japanese Patent Publication No. 28123/1973, sulfuric acid desmut method as described in Japanese Unexamined Patent Publication No. 12739/1978, etc.

When an aluminum support is used as the support in this invention, after effecting the above-mentioned pretreatment, the aluminum support is usually subjected to anodizing to form an oxide layer so as to enhance abrasion resistance, chemical resistance and water retention. In the anodizing, preferably employed is to effect electrolysis under current density of 1 to 10 $A/dm^2$ through an aqueous solution containing sulfuric acid and/or phosphoric acid in a concentration of 10 to 50% as an electrolyte. Beside, there may be employed a method in which electrolysis is carried out at a high current density in sulfuric acid as described in U.S. Pat. No. 1,412,768, and a method in which electrolysis is carried out by use of phosphoric acid as described in U.S. Pat. No. 3,511,661.

The most preferable support used in this invention is an aluminum support having anodized oxide layer.

A treatment to be applied to the support itself for enhancing adhesiveness between the support and the light-sensitive layer is not particularly limited, and thus a primer layer or the like can be provided on the support, as occasion demands.

Said primer layer may be composed of, for example, polyester resins, vinyl chloride - vinyl acetate copolymers, acrylic resins, vinyl chloride resins, polyamide resins, polyvinylbutyral resins, epoxy resins, acrylate copolymers, vinyl acetate copolymers, phenoxy resins, polyurethane resins, polycarbonate resins, polyacrylonitrilebutadiene, polyvinylacetates, etc.

As an anchoring agent constituting the primer layer may include, for example, silane coupling agents, silicone primer, etc, and also organic titanate and the like as an effective component.

The light-sensitive lithographic printing plate of this invention is made by providing a light-sensitive layer onto the support obtained in the above. Light-sensitive substances employed in the light-sensitive layer is not particularly limited, and may include, for example, various kinds mentioned below as usually used for light-sensitive lithographic printing plates.

1) Photo-Crosslinkable Light-Sensitive Resinous Compositions

The light-sensitive components in the photo-crosslinkable light-sensitive resinous compositions are composed of light-sensitive resins having unsaturated double bond in the molecular, for example, light-sensitive resins containing —CH═CH—CO— as a light-sensitive group in the polymer main chain as described in the specifications of U.S. Pat. Nos. 3,030,208, 3,435,237, 3,622,320, etc. and polyvinylcinnamate and the like having a light-sensitive group on the side chain of the polymer, etc.

2) Photopolymerizable Light-Sensitive Resinous Compositions

These are photopolymerizable compositions containing an addition-polymerizable unsaturated compound, and are comprised of a monomer having double bond and a high molecular binder. Typical examples of such a composition is described in U.S. Pat. Nos. 2,760,863, 2,791,504, etc. and may include photopolymerizable compositions such as a composition containing methyl methacrylate, a composition containing methylmethacrylate and polymethylmethacrylate, a composition containing methylmethacrylate, polymethylmethacrylate and polyethylene glycol dimethacrylate monomer, a composition containing methylmethacrylate, alkid resin and polyethylene glycol dimethacrylate monomer, and the like.

The photopolymerizable light-sensitive resinous composition may be added with photopolymerizaiton initiator usually employed in this field, for example, benzoine derivatives such as benzoine methyl ether, benzophenone derivatives such as benzophenone, thioxanthone derivatives, anthraquinone derivative, acridone derivative, etc.

3) Light-Sensitive Compositions Containing Diazo Compound

The diazo compounds in these compositions is a diaso resin as preferably exemplified by a condensate of aromatic diazonium salt and formaldehyde or acetoaldehyde. Particularly preferred are salts of condensate of p-diazodiphenylamine and formaldehyde or acetoaldehyde; diazo resin inorganic salts which is, for example, a reaction product of the above condensate with hexafluoro boric phosphate, tetrafluoroborate, perchlorate or periodate; diazo resin organic salts which is a reaction product of the above condensate with sulfonates as described in U.S. Pat. No. 3,300,309; and the like. Further, the diazo resins are preferably employed with a binder. Such a binder may include various polymer compounds. The polymer compounds may preferably include copolymers of a monomer having aromatic hydroxyl group as described in Japanese Unexamined Patent Publication No. 98613/1979 such as N-(4-hydroxyphenyl)-acrylamide, N-(4-hydroxyphenyl)-methacrylamide, o-, m- or p-hydroxystyrene and o-, m- or p-hydroxyphenylmethacryl-ate, with other monomer; a polymer containing as a main recurring unit hydroxyethylacrylate unit and hydroxyethylmethacrylate unit as described in U.S. Pat. No. 4,123,276; natural resins such as shellac and rosin; polyvinylalcohol; polyamide resins as described in U.S. Pat. No. 3,751,257; linear polyurethane resins as described in U.S. Pat. No. 3,660,097; cellulose derivatives such as phthalated resin of polyvinylalcohol, epoxy resin condensated from bisphenol A and epichlorohydrine, cellulose acetate and cellulose acetate phthalate.

4) Light-Sensitive Compositions Containing O-quinonediazide Compound

For the light-sensitive compositions containing o-quinonediazide compound, preferably employed are o-quinonediazide compound and alkaline-soluble resin in combination.

o-Quinonediazide compound may include ester compounds of o-naphthoquinonediazide sulfonic acid with polycondensated resin of phenols with aldehyde or ketone.

The phenols mentioned above may include, for example, monovalent phenols such as phenol, o-cresol, m-cresol, p-cresol, 3,5-xylenol, carvacrol and thimol, divalent phenols such as catechol, resorcin and hydroquinone, trivalent phenols such as pyrogallol and fluoroglucine. The aldehyde mentioned above may include formaldehyde, benzaldehyde, acetoaldehyde, crotonaldehyde, furfural, etc. Among them, preferred are formaldehyde and benzaldehyde. The ketone as mentioned above may include acetone, methylethylketone, etc.

Specific examples of the above polycondensated resin include phenol - formaldehyde resin, m-cresol-formaldehyde resin, m- and p- mixed cresol - formaldehyde resin, resorcin - benzaldehyde resin, pyrogallol - acetone resin, etc.

The condensation ratio of the o-naphthoquinonediazide sulfonic acid to OH group of the phenol group in the above o-naphthoquinonediazide compound (a reaction ratio to one OH group) should preferably be 15 to 80%, more preferably 20 to 45%.

As the o-quinonediazide compound employed in this invention, the following compounds described in Japanese Unexamined Patent Publication No. 43451/1983 may be used, for example, 1,2-quinonediazide compounds known in the art such as 1,2-benzoquinonediazide sulfonate, 1,2-naphthoquinonediazide sulfonate, 1,2-benzoquinonediazide sulfonate, 1,2-naphthoquinonediazide sulfonate; more specifically, phenyl 1,2-benzoquinonediazide-4-sulfonate, 1,2,1′,2′-di-(benzoquinonediazide-4-sulfonyl)dihydroxybiphenyl, 1,2-benzoquinonediazide-4-(N-ethyl-M-β-naphthyl)-sulfonamide, cyclohexyl 1,2-naphthoquinonediazide-5-sulfonate, 1-(1,2-naphthoquinonediazide-5-sulfonyl)-3,5-dimethylpyrazol, 4′-hydroxydiphenyl-4′-azo-β-naphthol 1,2-naphthoquinonediazide-5-sulfonate, N,N-di-(1,2-naphthoquinonediazide-5-sulfonyl)-aniline, 2′-(1,2-naphthoquinonediazide-5-sulfonyloxy)-1-hydroxyanthraquinone, 2,4-dihydroxybenzophenon 1,2-naphthoquinonediazide-5-sulfonate, 2,3,4-trihydroxybenzophenone 1,2-naphthoquinonediazide-5-sulfonate, a condensate of 2 mole of 1,2-naphthoquinonediazide-5-sulfonylchloride with 1 mole of 4,4′-diaminobenzophenone, a condensate of 2 mole of 1,2-naphthoquinonediazide-5-sulfonylchloride with 1 mole of 4,4′-dihydroxy-1,1′-diphenylsulfone, a condensate of 1 mole of 1,2-naphthoquinonediazide-5-sulfonylchloride and 1 mole of purpurogallin, 1,2-quinonediazide compounds such as 1,2-naphthoquinonediazide-5-(N-dihydroabiethyl)-sulfonic amide as described in "Light-Sensitive Systems" (J. Kosar, pp339 to 352, 1965, Johy Wiley & Sons Co., New York) and "Photoresist" (W. S. De Forest, 50, 1975, Mc Graw-Hill Co., New York). Furthermore, there may be mentioned 1,2-quinonediazide compounds described in each publication of Japanese Patent Publications No. 1953/1962, No. 3627/1962, No. 13109/1962, No. 26126/1965, No. 3801/1965, No. 5604/1970, No. 27345/1970 and No. 13013/1976, Japanese Unexamined Patent Publications No. 96575/1973, No. 63802/1973 and No. 63803/1973.

Among the above o-quinonediazide compounds, particularly preferred is o-quinonediazide compounds obtained by reacting 1,2-benzoquinonediazide sulfonylchloride or 1,2-naphthoquinonediazide sulfonylchloride with pyrogallol - acetone condensate resin or 2,3,4-trihydroxybenzophenone.

As the o-quinonediazido compound used in this invention, the above compounds may be used singly or in combination of two or more thereof.

The formulation ratio of the o-quinonediazide compounds used in this invention is preferably 5 to 60% by weight, more preferably 10 to 50% by weight in the light-sensitive composition.

As the alkaline soluble resin used in the light-sensitive composition, novolac resins, vinyl type polymers having phenolic hydroxyl group, condensed resins of polyvalent phenols with aldehyde or ketone as described in Japanese Unexamined Patent Publication No. 57841/1980, etc. may be included.

The novolac resins used in this invention may include, for example, phenol-formaldehyde resins, cresol-formaldehyde resins, phenol-cresol-formaldehyde copolycondensed resins as described in Japanese Unexamined Patent Publication No. 57841/1980, copolycondensed resins of p-substituted phenol with phenol, or cresol with formaldehyde as described in Japanese Unexamined Patent Publication No. 127553/1980, etc.

The molecular weight of the above novolac resins (polystyrene standard) is preferably $3.00\times10^2$ to $7.50\times10^3$ as a number average molecular weight Mn and $1.00\times10^3$ to $3.00\times10^4$ as a weight average molecular weight Mw, more preferably $5.00\times10^2$ to $4.00\times10^3$ as Mn and $3.00\times10^3$ to $2.00\times10^4$ as Mw.

The above novolac resins may be used simply or in combination of two or more thereof.

The formulation ratio of the above novolac resins is 5 to 95% by weight in the light-sensitive composition of this invention.

The vinyl type polymers having phenolic hydroxyl group is polymers having said phenolic hydroxyl group in the molecular structure, preferably polymers having the structural unit of at least one of the following formulae (I) to (V)

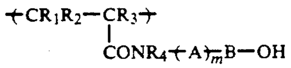

Formula (I)

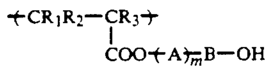

Formula (II)

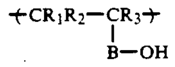

Formula (III)

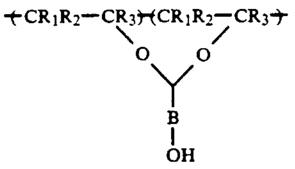

Formula (IV)

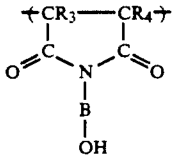

Formula (V)

In the formula, $R_1$ and $R_2$ each represent hydrogen atom, an alkyl group or a carboxy group, preferably hydrogen atom. $R_3$ represents hydrogen atom, a halogen atom or an alkyl group, preferably hydrogen atom and an alkyl group such as methyl group and ethyl group. $R_4$ represents hydrogen atom, an alkyl group, an aryl group or an aralkyl group, preferably hydrogen atom. A represents an alkylene group combining nitrogen atom or oxygen atom with an aromatic hydrocarbon, and may have substituent. m represents an integer of 0 to 10. B represents a phenylene group which may have a substituent or a naphthylene group which may have a substituent.

The polymers used for the light-sensitive composition of this invention is preferably those having a copolymer type structure. The monomer unit used in combination with the structural units represented by the formulae (I) to (V) may include vinyl type monomers, for example, ethylene type unsaturated olefins such as ethylene, propylene, isobutylene, butadiene and isoprene; styrenes such as styrene, α-methylstyrene, p-methylstyrene and p-chlorostyrene; acrylic acids such as acrylic acid and methacrylic acid; unsaturated aliphatic dicarboxylic acids such as itaconic acid, maleic acid and anhydrous maleic acid; α-methylene aliphatic monocarbonate such as methyl acrylate, ethyl acrylate, n-butyl acrylate, isobutyl acrylate, dodecyl acrylate, 2-chloroethyl acrylate, phenyl acrylate, methyl α-chloroacylate, methyl methacylate, ethyl methacrylate and ethyl ethacrylate; nitriles such as acrylonitrile and methacrylonitrile; amides such as acryl amide; anilidos such as acryl anilido, p-chloroacryl anilido, m-nitroacryl anilido and m-methoxyacryl anilido; vinyl esters such as vinyl acetate, vinyl propionate, vinyl benzoate and vinyl lactate; vinyl ethers such as methyl vinyl ether, ethyl vinyl ether, isobutyl vinyl ether and β-chloroethyl vinyl ether; vinyl chloride; vinylidene chloride; vinylidene cyanide; ethylene derivatives such as 1-methyl-1-methoxyethylene, 1,1-dimethoxyethylene, 1,2-dimethoxyethylene, 1,1-dimethoxycarbonylethylene and 1-methyl-1-nitroethylene; N-vinyl compounds such as N-vinylpyrole, N-vinylcarbazole, N-vinylindole, N-vinylpyrolidene and N-vinylpyrolidone, and the like. These vinyl monomers are present in the polymer compounds with the structure in which the unsaturated double bonds are cleaved.

Among the above monomers, esters or nitriles of the aliphatic monocarboxylic acid preferably exhibit excellent properties for the purpose of this invention.

These monomers may be present in the state of block or random in the polymer of this invention.

The formulation ratio of the vinyl type polymers used in this invention is 0.5 to 70% by weight in the light-sensitive composition.

The vinyl type polymers to be used in this invention may be employed simply or in combination of two or more thereof. Alternatively, the vinyl type monomers may be used in combination with other polymer compounds.

The light-sensitive composition may be added with a print out material which forms visible images by exposure. The print out material is made of a compound which forms an acid or a free radical by exposure and an organic dye which changes the tone through interaction with the compound. The compound which forms an acid or a free radical by exposure may include, for example, o-naphthoquinonediazide-4-sulfonic acid halogenide as described in Japanese Unexamined Patent Publication No. 36209/1975, trihalomethyl-2-pyrone and trihalomethyltriayine as described in Japanese Unexamined Patent Publication No. 36223/1978, o-naphthoquinonediazide-4-sufonyl chloride and phenoles having electron attractive substituent or ester compounds or amido compounds with anilinic acid as described in Japanese Unexamined Patent Publication No. 6244/1980, halomethyl vinyl oxadiazole compounds and diazonium salts as described in Japanese Unexamined Patent Publication No. 77742/1980 and No. 148784/1984, and the like.

The above-mentioned organic dye may include Victorial Pure Blue BOH (produced by Hodogaya Kagaku K.K.), Patent Pure Blue (produced by Sumitomo Mikuni Kagaku K.K.), Oil Blue #603 (produced by Orient Kagaku Kogyo K.K.), Sudan Blue II (produced by BASF), Crystal Violet, Marakite Green, Fuksin, Methyl Violet, Ethyl Violet, Methyl Orange, Briliant Green, Congo Red, Eosine, Rohdamine 6G, and the like. Beside the above materials, the light-sensitive composition may be added with plasticizers, surfactants, organic acids, anhydrous acids, etc., as occasion demands.

Further, the light-sensitive composition of this invention may be added with, for example, p-tert-butylphenol formaldehyde resin and p-n-octylphenol formaldehyde resin, and these resin partially esterified with o-quinonediazide compounds for enhancing ink receptivity.

The light-sensitive lithographic printing plate of this invention can be prepared by dissolving these respective components into the solvent mentioned below, coating the solution on the surface of the support and drying to provide the light-sensitive layer.

The solvent used when the respective components of the light-sensitive composition of this invention is dissolved, may include methyl cellosolve, methyl cellosolve acetate, ethyl cellosolve, ethyl cellosolve acetate, diethylene glycol monomethyl ether, diethylene glycol monoethyl ether, diethylene glycol dimethyl ether, diethylene glycol methylethyl ether, diethylene glycol diethyl ether, diethyl glycol monoisopropyl ether, propylene glycol, propylene glycol monomethyl ether acetate, propylene glycol monoethyl ether acetate, propylene glycol monobutyl ether, dipropylene glycol monomethyl ether, dipropylene glycol dimethyl ether, dipropylene glycol methylethyl ether, ethyl formate, propyl formate, butyl formate, amyl formate, methyl acetate, ethyl acetate, propyl acetate, butyl acetate, methyl propionate, ethyl propionate, methyl lactate, ethyl lactate, dimethyl formamide, dimethyl sulfoxide, dioxane, acetone, methyl ethyl ketone, cyclohexanone, methyl cyclohexanone, diacetone alcohol, acetyl acetone, γ-butylolactone, etc. These solvents may be used singly or in combination of two or more thereof.

The coating methods used for coating the light-sensitive composition of this invention onto the surface of the support may include methods well known in the prior art, for example, rotary coating, wire bar coating, dip coating, air knife coating, roll coating, blade coating and curtain coating and the like.

The coating amount, which varies depending on the purpose, should preferably be, for example, 0.05 to 5.0 $g/m^2$ as a solid content.

In use of the light-sensitive lithographic printing plate obtained in such a manner, processes usually employed in the prior art may be used, for example, a process in which a relief image is obtained by bringing a transparent original image having a line image or screen image to contact with a light-sensitive surface to effect exposure, followed by removal of the light-sensitive layer on the non-image portion with use of suitable developer. As the suitable light source for exposure, mercury lamp, metal halide lamp, xenon lamp, chemical lamp, carbon arc lamp, etc. may be employed.

As the developer used for development, preferred is alkali aqueous solution such as aqueous solution of sodium silicate, potassium silicate, sodium hydroxide, potassium hydroxide, tribasic sodium phosphate, dibasic sodium phosphate, sodium carbonate, potassium carbonate or the like. The concentration of the aqueous solution in this case, which varies depending on the kind of the light-sensitive composition and alkali, should preferably be in the range of 0.1 to 10% by weight. Said alkali aqueous solution may be added with organic solvents such as surfactants and alcohols.

This invention will be specifically illustrated by referring to examples, but by no means limited thereto, so long as this invention would not loose the gist thereof.

EXAMPLES 1 TO 10

Preparation of Support No. 1

An aluminum plate of 0.3 mm thick (material: 1050, tempering: H16) was degreased by immersing it in an aqueous solution of 5% sodium hydroxide at 65° C. for 1 minute, washed with water, dipped in an aqueous solution of 10% nitric acid at 25° C. for 1 minute, neutralized, and washed with water. The aluminum plate was subjected to electrolytic roughening in an aqueous solution of nitric acid of 0.3 mol/lit. at 30° C. under alternating current density of 50 $A/dm^2$ followed by desmatting treatment in an aqueous solution of 5% sodium hydroxide at 60° C. for 10 seconds. The aluminum plate was anodized in an aqueous solution of 20% sulfuric acid at 20° C. under current density of 3 $A/dm^2$ for 1 minute, and thereafter subjected to hot water sealing with hot water of 80° C.

The aluminum plate treated was immersed in an aqueous solution of 1% sodium nitrite at 80° C. for 1 minute, and washed with water, followed by drying for 5 minutes.

Preparation of Support Nos. 2 to 5

Support Nos. 2 to 5 were prepared in the same manner as in the preparation of Support No. 1 except for employing the following aqueous solution in place of the aqueous solution of 1% sodium nitrite and changing the dipping time in each aqueous solution of the aluminum plates after hot water sealing to 30 minutes.

Support No. 2—aqueous solution of 1% potassium nitrite
Support No. 3—aqueous solution of 1% calcium nitrite
Support No. 4—aqueous solution of 1% ammonium nitrite
Support No. 5—aqueous solution of 1% nickel nitrite

Preparation of Support Nos. 6 TO 10

Support Nos. 6 to 10 were prepared in the same manner as in the preparation of Sample No. 1 except for employing the following aqueous solution in place of the aqueous solution of 1% sodium nitrite and changing the dipping time in each aqueous solution of the aluminum plates after hot water sealing to 30 minutes.

Support No. 6—aqueous solution of 1% sodium nitrate
Support No. 7—aqueous solution of 1% potassium nitrate
Support No. 8—aqueous solution of 1% calcium nitrate
Support No. 9—aqueous solution of 1% zinc nitrate Support No. 10—aqueous solution of 1% nickel nitrate

Preparation of Light-Sensitive Lithographic Printing Plate Sample No. I - 1

The light-sensitive composition coating liquid (I) having the composition shown below was coated on Support No. 1 prepared in the above by using a wire bar and dried at 80° C. for 2 minutes. The coating amount was 2.2 g/m$^2$.

Composition of the Light-Sensitive Composition Coating Liquid (I)

| | |
|---|---|
| Novolac resin | |
| copolycondensed resin of phenol, m-cresol, p-cresol and formaldehyde (mole ratio of phenol, m-cresol and p-cresol is 2.0:4.8:3.2, Mw = 6500, Mw/Mn = 5.4) | 6.7 g |
| o-Quinonediazido compound | 1.5 g |
| 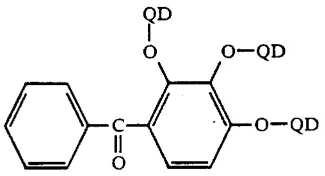 | |
| QD: 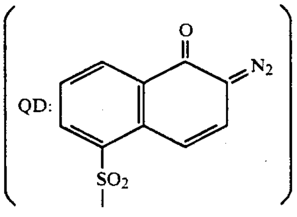 | |
| Surfactant | |
| Emulgen 120 (manufactured by Kao K.K.) (polyoxyethylene lauryl ether) | 0.2 g |
| Victoria Pure Blue BOH (manufactured by Hodogaya Kagaku K.K.) | 0.08 g |
| Compound which produces a halogen radical group 2-Trichloromethyl-5-(p-methoxystyryl)-1,3,4-oxadiazol (compound described in Example 1 of the publication of Japanese Unexamined Patent Publication No. 74728/1979) | 0.15 g |
| Methyl cellosolve | 100 ml |

To Light-sensitive lithographic plate sample No. I-1, exposure was effected by irradiating at 8 mW/cm$^2$ by use of 2kw metal halide lump for 60 seconds. Development was made by using 5-fold dilute solution of commercially available developer SDR-1 (manufactured by Konica Corporation) at a development temperature of 25° C. for 30 seconds to obtain Lithographic printing plate sample No.I-1.

Preparation of Light-Sensitive Lithographic Printing Plate Sample Nos. I-2 to I-10

Light-sensitive lithographic printing plate sample Nos. I-2 to I-10 were prepared in the same manner as in the preparation of Light-sensitive lithographic printing plate sample No. I-1 except for employing Support No. 2 to 10 in place of Support No. 1.

These samples were exposed and developed similarly as in the case of Light-sensitive lithographic printing plate I-1 to obtain Lithographic printing plates sample Nos. I-2 to I-10. These samples were subjected to the estimations shown below.

COMPARATIVE EXAMPLES 1 AND 2

Preparation of Support Nos. 11 and 12

Support Nos. 11 and 12 were prepared in the same manner as in the preparation of Support No. 1 except for employing the following aqueous solution in place of the aqueous solution of 1% sodium nitrite.

Support No. 11—aqueous solution of 1% sodium sulfate

Support No. 12—aqueous solution of 1% barium acetate

Preparation of Light-Sensitive Lithographic Printing Plate Sample Nos. I-11 and I-12

Light-sensitive lithographic printing plate Nos. I-11 and I-12 were prepared in the same manner as in the preparation of Light-sensitive lithographic printing plate sample No. I-1 except for employing Support Nos. 11 and 12 as a support.

These samples were exposed and developed similarly as in the case of Light-sensitive lithographic printing plate I-1 to obtain Lithographic printing plates sample Nos. I-11 to I-12. These samples were subjected to the estimations shown below.

EXAMPLES 11 to 20

Support No. 1 was coated with a coating liquid comprising the light-sensitive composition (2) having the composition shown below by use of whirler. Thereafter, the coated plate was dried at 90° C. for 1 minute. The coating amount was 1.7 g/m$^2$. The resulting sample is called as Light-sensitive lithographic printing plate sample No. II-1.

Coating solution of light-sensitive lithographic printing plate (2)

| | |
|---|---|
| Copolymer | |
| copolymer of p-hydroxyphenyl methacrylamide/-acrylonitrile/ethyl acrylate/methacrylic acid = 10/30/60/6 (Mw = 60,000) | 5.0 g |
| Diazo resin | 0.5 g |
| 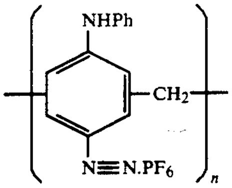 Ph: phenyl group n = 5 | |
| Julimer AC-10L (manufactured by Nihon Junyaku K.K.) | 0.05 g |
| Victoria Pure Blue BOH (manufactured by Hodogaya Kagaku K.K.) | 0.1 g |
| Methyl Cellosolve | 100 ml |

To the plate sample No. II-1, exposure was effected under 8 mW/cm$^2$ by use of 2 kw metal halide lamp for 60 seconds and development was effected at a developing temperature of 27° C. for a developing time of 20 seconds with use of 4-fold dilute solution to obtain Lithographic printing plate sample No. II-1.

Preparation of Light-Sensitive Lithographic Printing Plate Sample Nos. II-2 to II-10

Support Nos. 2 to 10 were coated with the above-mentioned coating liquid of light-sensitive composition (2) in the same manner as in the preparation of Light-sensitive lithographic printing plate sample No. II-1 to prepare Light-sensitive lithographic printing plate sample Nos. II-2 to 10.

COMPARATIVE EXAMPLES 3 AND 4

Support Nos. 11 and 12 were coated with the above-mentioned coating liquid of light-sensitive composition (2) in the same manner as in the preparation of Light-sensitive lithographic printing plate sample No. II-1 to prepare Light-sensitive lithographic printing plate sample Nos. II-11 and 12.

These plate sample Nos. II-1 and II-2 were subjected to exposure and development similarly as in the case of Light-sensitive lithographic printing plate sample No. II-1 to obtain Lithographic printing plate sample Nos. 11 and 12. These samples were subjected to the estimations shown below.

Estimation Methods

Stain Test

On the lithographic printing plates obtained under the above exposure and development conditions, imaging area comprising five lines (5 mm×15 cm) were formed and the imaging area was erased by using an erasing liquid (SIR-15, manufactured by Konica Corporation). Erasing time was estimated by 5 standards or 5 ranks (shown in Table 1), and fringe stain due to erasing was confirmed by inking a protection ink (SPO-1, manufactured by Konica Corporation).

Standard of Estimation

A: good
B: erasing trace appears (ink does not adhere, but residual light-sensitive layer can be clearly confirmed with eyes)
C: stain (ink adheres)

Resistance to Chemicals

After preparation of the printing plate under the above-mentioned exposure and development conditions, the printing plate was immersed for a constant time in protection inks for inking (SPO-1 manufactured by Konica Corporation and PI manufactured by Fuji Photo Film Co.) and plate cleaner used for printing (UPC manufactured by ABC Chemical Co.), and the condition of the light-sensitive layer on the plate was estimated.

Standard of Estimation

A: no change
B: surface of solid image is erroded
C: solid image peels off

Halftone Reproduction

The lithographic printing plates prepared by exposure and development in the above were used for printing with use of a printing machine (Hydel GTO) by using a coat paper printing ink (New Bright Kurenai manufactured by Toyo Ink Production K.K.) and a dampening solution (SEU-3, 2.5%, manufactured by Konica Corporation). The halftone reproduction in shadow of halftone image of the printed matter (halftone are ratio=97%) was estimated by using 25-magnification test glass.

Standard of Estimation

A: reproduction (without plugging)
B: poor reproduction (with plugging) (Plugging is a phenomenon in which inks adhere onto the areas other than halftone area)

Press Life

In the above-mentioned printing condition, the printing was continued until occurance of adhesion failure on solid image of imaging area of printed matters or until ink adheres on non-imaging area. The number of printed papers were counted.

The results are shown in Tables 1 and 2.

TABLE 1

| | Support | Light-sensitive lithographic printing plate sample | Stain test due to residual grease 15 sec. | 30 sec. | 1 min. | 3 min. | 5 min. | Ant-treating chemical property 30 min. | 1 hr. | Halftone reproduction (97% Halftone) | Press life (ten thousand) |
|---|---|---|---|---|---|---|---|---|---|---|---|
| Example 1 | 1 | I-1 | A | A | A | A | A | A | A | A | 20 |
| Example 2 | 2 | I-2 | A | A | A | A | A | A | A | A | 20 |
| Example 3 | 3 | I-3 | A | A | A | A | A | A | A | A | 18 |
| Example 4 | 4 | I-4 | A | A | A | B | B | A | A | A | 18 |
| Example 5 | 5 | I-5 | A | A | A | A | A | A | A | A | 20 |
| Comp. exm. 1 | 11 | I-11 | B | B | B | C | C | A | B | C | 15 |
| Comp. exm. 2 | 12 | I-12 | A | A | A | B | B | B | C | C | 10 |
| Example 6 | 6 | I-6 | A | A | A | A | B | A | B | A | 20 |
| Example 7 | 7 | I-7 | A | A | A | B | B | A | B | A | 15 |
| Example 8 | 8 | I-8 | A | A | A | B | B | A | B | A | 15 |
| Example 9 | 9 | I-9 | A | A | A | B | B | A | B | A | 15 |
| Example 10 | 10 | I-10 | A | A | A | B | B | A | B | A | 15 |

TABLE 2

| | Support | Light-sensitive lithographic printing plate sample | Stain test due to residual grease 15 sec. | 30 sec. | 1 min. | 3 min. | 5 min. | Halftone reproduction (97% Halftone |
|---|---|---|---|---|---|---|---|---|
| Example 11 | 1 | II-1 | A | A | A | A | A | A |
| Example 12 | 2 | II-2 | A | A | A | A | A | A |
| Example 13 | 3 | II-3 | A | A | A | A | A | A |
| Example 14 | 4 | II-4 | A | A | A | B | B | A |
| Example 15 | 5 | II-5 | A | A | A | A | A | A |
| Comp. exm. 3 | 11 | II-11 | B | B | B | C | C | C |
| Comp. exm. 4 | 12 | II-12 | A | A | A | B | A | C |
| Example 16 | 6 | II-6 | A | A | A | A | B | A |
| Example 17 | 7 | II-7 | A | A | A | B | B | A |
| Example 18 | 8 | II-8 | A | A | A | B | B | A |
| Example 19 | 9 | II-9 | A | A | A | B | B | A |
| Example 20 | 10 | II-10 | A | A | A | B | B | A |

EXAMPLES 21 TO 30

Preparation of Support Nos. 13 to 17

Preparation of Support No. 1 in Example 1 was repeated except for employing the following aqueous solutions in place of aqueous solution of 1% sodium nitrite to prepare Support Nos. 13 to 17.

Support No.13—aqueous solution of 0.5% sodium nitrite

Support No.14—aqueous solution of 0.5% potassium nitrite

Support No.15—aqueous solution of 0.5% calcium nitrite

Support No.16—aqueous solution of 0.5% ammonium nitrite

Support No 17—aqueous solution of 0.5% nickel nitrite

Light-sensitive lithographic printing plate sample Nos. III-1 to III-5 were prepared in the same manner as in the preparation of Light-sensitive lithographic printing plate sample No. I-1 except for employing Support Nos. 13 to 17 in place of Support No. 1.

Light-sensitive lithographic printing plate sample Nos. IV-1 to IV-5 were prepared in the same manner as in the preparation of Light-sensitive lithographic printing plate sample No. II-1 except for employing Support Nos. 13 to 17 in place of Support No. 1.

Light-sensitive lithographic printing plate sample Nos. III-1 to III-5 and IV-1 to IV-5 were subjected to exposure and development in the same manner as in Example 1 to obtain Lithographic printing plate sample Nos. III-1 to III-5 and IV-1 to IV-5. The same estimation tests as in Example 1 were conducted to these lithographic printing plate samples. The results are shown in Tables 3 and 4.

TABLE 3

| | Support | Light-sensitive lithographic printing plate sample | Stain test due to residual grease 15 sec. | 30 sec. | 1 min. | 3 min. | 5 min. | Ant-treating chemical property 30 min. | 1 hr. | Halftone reproduction (97% Halftone) | Press life (ten thousand) |
|---|---|---|---|---|---|---|---|---|---|---|---|
| Example 21 | 13 | III-1 | A | A | A | A | A | A | A | A | 20 |
| Example 22 | 14 | III-2 | A | A | A | A | A | A | A | A | 20 |
| Example 23 | 15 | III-3 | A | A | A | A | A | A | A | A | 20 |
| Example 24 | 16 | III-4 | A | A | A | A | B | A | A | A | 20 |
| Example 25 | 17 | III-5 | A | A | A | A | B | A | A | A | 20 |

TABLE 4

| | Support | Light-sensitive lithographic printing plate sample | Stain test due to residual grease 15 sec. | 30 sec. | 1 min. | 3 min. | 5 min. | Halftone reproduction (97% Halftone) |
|---|---|---|---|---|---|---|---|---|
| Example 26 | 13 | IV-1 | A | A | A | A | A | A |
| Example 27 | 14 | IV-2 | A | A | A | A | A | A |
| Example 28 | 15 | IV-3 | A | A | A | A | A | A |
| Example 29 | 16 | IV-4 | A | A | A | A | B | A |
| Example 30 | 17 | IV-5 | A | A | A | A | B | A |

From the above test results, it is apparent that the light-sensitive lithographic printing plate of this invention is excellent in protection from stain due to residual light-sensitive layer of development processing and in press life as compared with conventional plates.

According to this invention, light-sensitive lithographic printing plate which is free from stain due to residual light-sensitive layer, excellent in developability, good in water retention at image area and excellent in press life, can be obtained.

We claim:

1. A light-sensitive lithographic printing plate which comprises an aluminum or aluminum alloy support having been pretreated and a light-sensitive layer provided thereon, wherein the surface of the support adjacent to the light-sensitive layer is anodized, following by being treated with an aqueous solution containing 0.001 to 10% by weight based on the aqueous solution, of a nitrile selected from the group consisting of $NaNO_2$ and $KNO_2$.

2. The light-sensitive lithographic printing plate according to claim 1, wherein the amount of nitrite is 0.01 to 2% by weight based on the aqueous solution.

3. The light-sensitive lithographic printing plate according to claim 2, wherein the amount of nitrite is 0.05 to 1% by weight based on the aqueous solution.

4. The light-sensitive lithographic printing plate according to claim 1, wherein the treatment by using the aqueous solution is carried out by dipping the support into the aqueous solution within a temperature range from a room temperature to about 100° C. for 15 to 300 seconds, or coating the aqueous solution onto the support.

5. The light-sensitive lithographic printing plate according to claim 4, wherein the treatment by using the aqueous solution is carried out by dipping the support into the aqueous solution within a temperature range from 50° to 80° C. for 30 to 180 seconds.

6. The light-sensitive lithographic printing plate according to claim 5, wherein the treatment by using the aqueous solution is carried out by dipping the support into the aqueous solution within a temperature range from 70° to 80° C. for 50 to 80 seconds.

7. The light-sensitive lithographic printing plate according to claim 1 wherein the nitrite is $NaNO_2$.

8. The light-sensitive lithographic printing plate according to claim 1 wherein the nitrite is $KNO_2$.

9. The light-sensitive lithographic printing plate according to claim 6 wherein the nitrite is $NaNO_2$.

10. The light-sensitive lithographic printing plate according to claim 6 wherein the nitrite is $KNO_2$.

* * * * *